United States Patent
Chou et al.

(10) Patent No.: US 6,930,060 B2
(45) Date of Patent: Aug. 16, 2005

(54) METHOD FOR FORMING A UNIFORM DISTRIBUTION OF NITROGEN IN SILICON OXYNITRIDE GATE DIELECTRIC

(75) Inventors: Anthony I. Chou, Fishkill, NY (US); Michael P. Chudzik, Beacon, NY (US); Toshiharu Furukawa, Essex Junction, VT (US); Oleg Gluschenkov, Poughkeepsie, NY (US); Paul D. Kirsch, Fishkill, NY (US); Kristen C. Scheer, Milton, NY (US); Joseph Shepard, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 10/250,257

(22) Filed: Jun. 18, 2003

(65) Prior Publication Data

US 2004/0256664 A1 Dec. 23, 2004

(51) Int. Cl.⁷ .......................... H01L 21/31; H01L 29/76
(52) U.S. Cl. ....................... 438/786; 438/287; 438/785; 257/410; 257/411
(58) Field of Search ................... 438/287, 778, 438/785–788, 791, 792; 257/310, 410, 411

(56) References Cited

U.S. PATENT DOCUMENTS

| | | | |
|---|---|---|---|
| 5,916,365 A | 6/1999 | Sherman | |
| 6,200,893 B1 * | 3/2001 | Sneh | 438/685 |
| 6,342,277 B1 | 1/2002 | Sherman | |
| 6,348,420 B1 | 2/2002 | Raaijmakers et al. | |
| 6,391,785 B1 | 5/2002 | Satta et al. | |
| 6,391,803 B1 | 5/2002 | Kim et al. | |
| 6,407,435 B1 | 6/2002 | Ma et al. | |
| 6,420,279 B1 * | 7/2002 | Ono et al. | 438/785 |
| 6,451,695 B2 | 9/2002 | Sneh | |
| 6,468,924 B2 | 10/2002 | Lee et al. | |
| 6,475,910 B1 | 11/2002 | Sneh | |
| 6,482,733 B2 | 11/2002 | Raaijmakers et al. | |
| 6,645,882 B1 * | 11/2003 | Halliyal et al. | 438/785 |

* cited by examiner

*Primary Examiner*—Kevin M. Picardat
(74) *Attorney, Agent, or Firm*—Mark R. Bilak; Steven Fischman

(57) ABSTRACT

Methods for preparing a silicon oxynitride layer where the silicon oxynitride layer is deposited atop a substrate and have a low concentration of nitrogen at the interface of the silicon oxynitride layer and the substrate. The silicon oxynitride layer is formed by pulsing at least one interface precursor onto a substrate, where said substrate chemisorbs a portion of said at least one interface precursor to form a monolayer of said at least one interface precursor; and pulsing a nitrogen-containing precursor onto said substrate containing said monolayer of interface precursor, where said monolayer of said at least one interface precursor chemisorbs a portion of said nitrogen-containing precursor to form a monolayer of said nitrogen-containing precursor. The interface precursor includes oxygen-containing or silicon-containing precursor gasses.

20 Claims, 7 Drawing Sheets

METHOD FOR FORMING A UNIFORM DISTRIBUTION OF NITROGEN IN SILICON OXYNITRIDE GATE DIELECTRIC

BACKGROUND OF INVENTION

The present invention relates to a method for forming gate dielectrics, and more particularly, to an atomic layer deposition method for uniformly depositing silicon oxynitride ($SiO_xN_y$) having a low nitrogen concentration at an interface between the substrate and gate dielectric.

With decreasing gate lengths in metal oxide semiconductor field effect transistors, thin gate oxides, on the order of 2 nm or less, are necessary to increase drive currents and improve short-channel behavior. Silicon dioxide has been one of the most important and widely used materials in the microelectronics industry. One of the biggest technological challenges facing the semiconductor industry is finding a replacement gate dielectric for $SiO_2$ for future metal oxide semiconductor field effect transistors.

Silicon oxynitride ($SiO_xN_y$) is a likely gate dielectric for future complementary metal oxide semiconductor (CMOS) devices. Layers of pure $SiO_2$ are too limiting because $SiO_2$ has a low dielectric constant. A long list of improved electrical properties of oxynitride films compared to $SiO_2$ include: immunity to hot carrier effects, resistance to boron diffusion, higher charge to breakdown effects and an incremental increase in dielectric constant. Layers of pure SiN are too limiting because of the increased levels of fixed charge and mobility degradation associated with SiN. High-k dielectrics, such as $HfO_2$, may also be limiting due to charge trapping, mobility, and cross-contamination in conventional CMOS process flows.

One reason for N incorporation into $SiO_2$ is to increase the dielectric constant of the film. As silicon oxynitrides are scaled below 2.0 nm, it is desirable to place more N in the film in order to increase the dielectric constant. Dielectric constant is a numerical value representing the effectiveness of a non-conductive material to store electrical charge under the influence of a potential difference. Increasing the dielectric constant of the silicon oxynitride allows the film to be physically thicker, thereby reducing gate leakage current, while maintaining the same capacitance needed to meet the drive current target.

In addition to incorporating N into the film, the placement or distribution of N throughout the film is equally important. Present thermal methods leave little control over the placement of nitrogen in silicon oxynitride films. N placement in oxynitrides films has been done by thermal anneals of $SiO_2$ in a NO, $N_2O$, or $NH_3$ ambient. Additionally, direct (oxy) nitridation of Si(100) can be done with NO, $N_2O$, or $NH_3$. Unfortunately, N placement cannot be manipulated with a single hot process step. Plasma nitridation has been shown to restrict N placement to top surfaces in thick oxynitride (â 2.0 nm) films, but becomes less discriminating for sub 2.0 nm films.

Referring to FIG. 1, direct oxynitridation of Si in $N_2O$ places N 5 predominantly at the interface 2 between the Si substrate 1 and the gate dielectric 3. Similarly, nitridation of SiO(N) with $NH_3$ anneals also places N 5 predominantly at the interface 2 between the Si substrate 1 and the gate dielectric 3. Plasma nitridation places N 5 at the top surfaces of the gate dielectric 3 and/or at the Si substrate/gate dielectric interface 2. Additionally, as oxynitrides scale below 2.0 nm, plasma nitridation becomes less exacting; a larger fraction of N 5 penetrates to the interface 2 between the Si substrate and the gate dielectric 3. Both thermal and plasma processes provide non-uniform N distributions with limited control, typically placing N 5 at the Si substrate/dielectric interface 2. This property is commonly referred to as N pile-up.

N pile-up is further illustrated in FIG. 2, which depicts the results of a Secondary Ion Mass Spectrometry (SIMS) depth profile analysis of a sample of a conventionally formed silicon oxynitride layer atop a Si substrate. The Y-axis of the graph represents the concentration of atoms in the sample and the X-axis represents the depth from the surface of the sample. Referring to FIG. 2, the Si trace-line 7 indicates that at depths greater than approximately 5.0 nm the concentration of Si atoms remains constant. The region of the sample at a depth greater than about 5.0 nm represents the Si substrate; and the region from 0 to about 5.0 nm represents the silicon oxynitride layer. The interface between the silicon oxynitride layer and the substrate is indicated by reference line 8. The N trace line 9 peaks at the interface 8 between the silicon oxynitride layer and the Si substrate, therefore exhibiting N pile-up where a high concentration of nitrogen is present between the silicon oxynitride layer and the Si substrate.

Nitrogen (N) pile-up at the gate dielectric/substrate interface can negatively impact device attributes, such as device drive current. The presence of N atoms in close proximity to the channel of the transistor may cause charge carriers passing through the channel to scatter. This scattering may be caused by the fixed charge associated with N atoms piled near the dielectric/substrate interface. The scattering phenomena are believed to be one mechanism by which charge carriers are slowed as they travel from the source to the drain of a transistor. The closer the fixed charge to the channel the worse the scattering is likely to be. Hence, N pile-up likely decreases carrier mobility.

Mobility degradation can be addressed by manipulating the N distribution (and therefore the fixed charge distribution) in the film such that there is minimal impact on the charge carriers traveling across the channel region of the transistor.

N pile-up can also negatively impact the reliability of the device. Negative bias temperature instability (NBTI) is a key reliability issue for the P-type field effect transistors (PFET). In severe cases NBTI may lead to 50–100 mV shifts in PFET threshold voltages ($V_t$) during normal device operation. Vt shifts can negatively impact device drive current performance.

Evidence in the prior art suggests that N pile-up is linked to NBTI. Interfacial N decreases interface state ($N_{it}$) and positive fixed charge ($Q_f$) activation energies. Therefore, in the presence of increased interfacial N, $N_{it}$ and $Q_f$ form with greater probability. $N_{it}$ and $Q_f$ are believed to lead to the NBTI reliability problem that manifests itself as PFET Vt shift during PFET operation.

It would be highly desirable to provide a deposition method that produces a silicon oxynitride gate dielectric that does not exhibit N pile-up at the gate dielectric/substrate interface.

SUMMARY OF INVENTION

The present method advantageously provides a silicon oxynitride film with a controlled N profile, where N pile-up at the gate dielectric/substrate interface can be substantially avoided. A further advantage of the present invention is to control N content in material layers utilized in CMOS production, where the ratio of nitrogen to oxygen (i.e., N:O)

may range from 0 to greater than 1. The present invention also provides low processing temperatures on the order of, or less than 500Â° C., preferably ranging from −200Â° C. to 500Â° C.

The above advantages of the present invention are achieved through the incorporation of the principals of atomic level deposition utilizing uniquely qualified precursor gasses. Atomic layer deposition can form thin (2 nm or less), uniform films with good electrical and physical properties and fill high aspect ratio (60) structures. Additionally, the low processing temperatures possible with atomic layer deposition reduce the probability of N diffusion to the interface between a substrate and the deposited gate dielectric layer.

In accordance with the present invention, atomic layer deposition forms an atomic layer by alternately supplying a precursor gas and a purging gas. The precursor should have a self-limiting effect such that the precursor is adsorbed on the substrate in the form of a monolayer. A monolayer is a single layer of molecules or atoms chemisorbed upon a deposition surface. Because of the self-limiting effect, only one monolayer or sub-monolayer is deposited per operation cycle, and additional precursor will not be deposited on the grown layer even excess precursor is supplied. In atomic layer deposition, the precursor should readily adsorb at bonding sites on the growth surface of the substrate in a self-limiting mode, and once adsorbed the monolayer of first precursor should readily react with another precursor to form the desired film.

Atomic layer deposition is driven by the catalytic properties of the surface and the precursor molecules themselves. A pulse of precursor gas chemisorbs onto the surface until the surface becomes saturated, ceasing the reaction. For example, an —OH terminated surface may react with silicon tetrachloride ($SiCl_4$) in the following way: the —OH acts as a nucleophile attacking the Si metal center forming a covalent bond with Si. Concurrently, —Cl acts as a leaving group from the Si center, abstracts a H atom and desorbs as HCl. Once every surface OH site reacts with the Si atom of silicon tetrachloride, the surface becomes inert to further chemisorption reactions. At this point, the chamber is purged to remove all non-reacted and/or physisorbed species. A second reactive precursor gas such as $NH_3$ is then pulsed in which the $NH_3$ reacts with the Si adatoms to form some fraction of a N monolayer. Again, —Cl likely leaves the surface as HCl.

In summary, each newly deposited monolayer creates a reactive surface for the following precursor such that it chemisorbs in a self-limiting manner. By repeating these pulses in a controlled way, a thin film is grown. Atomic layer deposition of silicon oxynitride can be achieved by alternately pulsing a Si-containing, a N-containing, and an O-containing precursors.

In broad terms the above advantages are achieved by the present method, which comprises: a) providing an OH terminated substrate; b) pulsing a Si-containing precursor onto the OH terminated substrate so that the OH terminated substrate chemisorbs a portion of the Si-containing precursor to form a Si-monolayer; and c) pulsing a N-containing precursor onto said Si-monolayer so that said Si-monolayer chemisorbs a portion of said N-containing precursor to form a N-monolayer.

A further processing step of the method of the present invention includes: d) pulsing an other Si-containing precursor or a Hf-containing precursor to form an other Si-monolayer or a Hf-monolayer; and e) pulsing an O-containing precursor or other N-containing precursor to form a O-monolayer or other N-monolayer.

Steps d) and step e) of the above process may be performed (n) times, where (n) is a whole number equal to or greater than 1 and less than 50.

The above-described process may be used to form a gate dielectric having a uniform N distribution atop a substrate where the interface between the substrate and the gate dielectric has a low ratio of N:O, in the range of about 0 to about 0.05. The O-containing precursor comprises $H_2O$, $O_2$, $O_3$, $H_2O_2$ or O* radicals. The Si-containing precursor comprises silicon tetrachloride, dichlorosilane, monochlorosilane, or combinations thereof. The N-containing precursor comprises $NH_3$, $N_2H_4$ or plasma forming N* radicals. The Hf-containing precursor comprises $HfCl_4$, $Hf(OC_2H_5)_4$ or $Hf(OC_4H_9)_4$. The precursor pulse cycle requires alternating metal/non-metal precursors in order to maintain chemisorption. Metal precursors include Si-containing precursors and Hf-containing precursors. Non-metal precursors include O-containing precursors and N-containing precursors.

The present invention also contemplates various integration schemes to produce composite gate dielectrics utilizing the benefits of low temperature, ultra thin, composition controlled ALD of $SiO_xN_y$. In one embodiment of the present invention, a method of forming a composite gate is provided comprising the steps of: forming a first dielectric layer atop a substrate; and forming a second dielectric layer atop said first dielectric layer; where the second dielectric layer is formed by pulsing an O-containing precursor atop said first dielectric layer to form an O-monolayer; pulsing a Si-containing precursor atop said O-monolayer to form a Si-monolayer, and pulsing a N-containing precursor atop the Si-monolayer to form a N-monolayer, where pulsing O-containing precursor, pulsing Si-containing precursor and pulsing N-containing precursor is performed (n) times, where (n) is a whole number equal to or greater than 1.

In another embodiment of the present invention, a method of forming a composite gate dielectric having a photoresist layer is provided. This method comprises the steps of: forming a first dielectric layer atop a substrate; forming a photoresist layer atop the first dielectric layer; patterning the photoresist layer to expose a portion of the first dielectric layer; selectively etching the exposed portion of the first dielectric layer to expose the substrate; stripping the photoresist layer; and forming a second dielectric layer atop the first dielectric layer and the exposed substrate, where N-monolayer is deposited atop second dielectric layer.

In another embodiment of the present invention, a method of forming a composite gate dielectric having a photoresist layer is provided. This method comprises the steps of: forming a first dielectric layer atop a substrate; forming a photoresist layer atop a portion of the first dielectric layer; and forming a second dielectric layer atop the first dielectric layer or a stripped portion of the Si substrate and atop the photoresist layer where the second dielectric layer is formed by pulsing an O-containing precursor atop the first dielectric layer to form an O-monolayer, pulsing a Si-containing precursor atop the O-monolayer to form a Si-monolayer, and pulsing a N-containing precursor atop the Si-monolayer to form a N-monolayer, where pulsing an O-containing precursor, pulsing a Si-containing precursor and pulsing a N-containing precursor is performed (n) times, where (n) is a whole number equal to or greater than 1.

In addition to the above methods, the present invention also contemplates a silicon oxynitride layer atop a substrate where the silicon oxynitride layer comprises a N:O ratio of about 0 to about 0.05 at an interface between the silicon oxynitride layer and the substrate, where the silicon oxynitride layer includes a concentration of Cl on the order of about 1 atomic percent. In another embodiment of the present invention, a silicon oxynitride layer having a N:O ratio of about 0.05 to about 10 at a surface opposite the interface between the silicon oxynitride layer and the substrate is provided.

Another embodiment of the present invention comprises a HfSiON layer atop a substrate where the HfSiON layer comprises a N:O ratio of about 0 to about 0.05 at an interface between the HfSiON layer and the substrate, where the HfSiON layer includes a concentration of Cl on the order of about 1 atomic percent. In another embodiment of the present invention, a HfSiON layer having a N:O ratio of about 0.05 to about 10 at a surface opposite the interface between the HfSiON layer and the substrate is provided.

DETAILED DESCRIPTION

Figure 1:
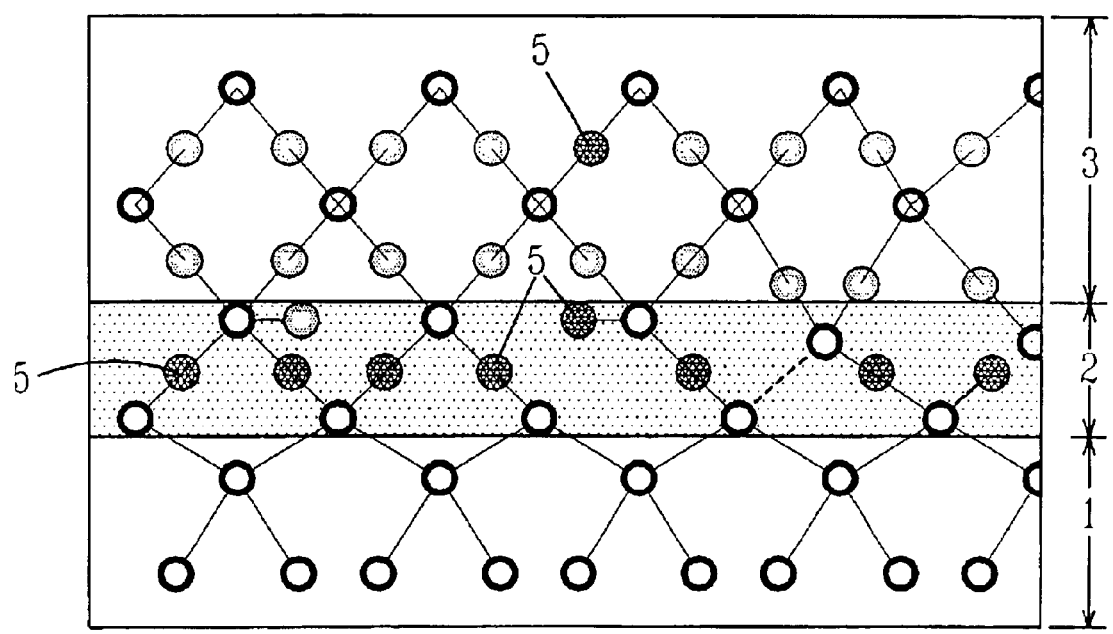
FIG. 1 is a pictorial representation (through cross sectional view) showing N pile-up at the gate dielectric/substrate interface.
Figure 2:
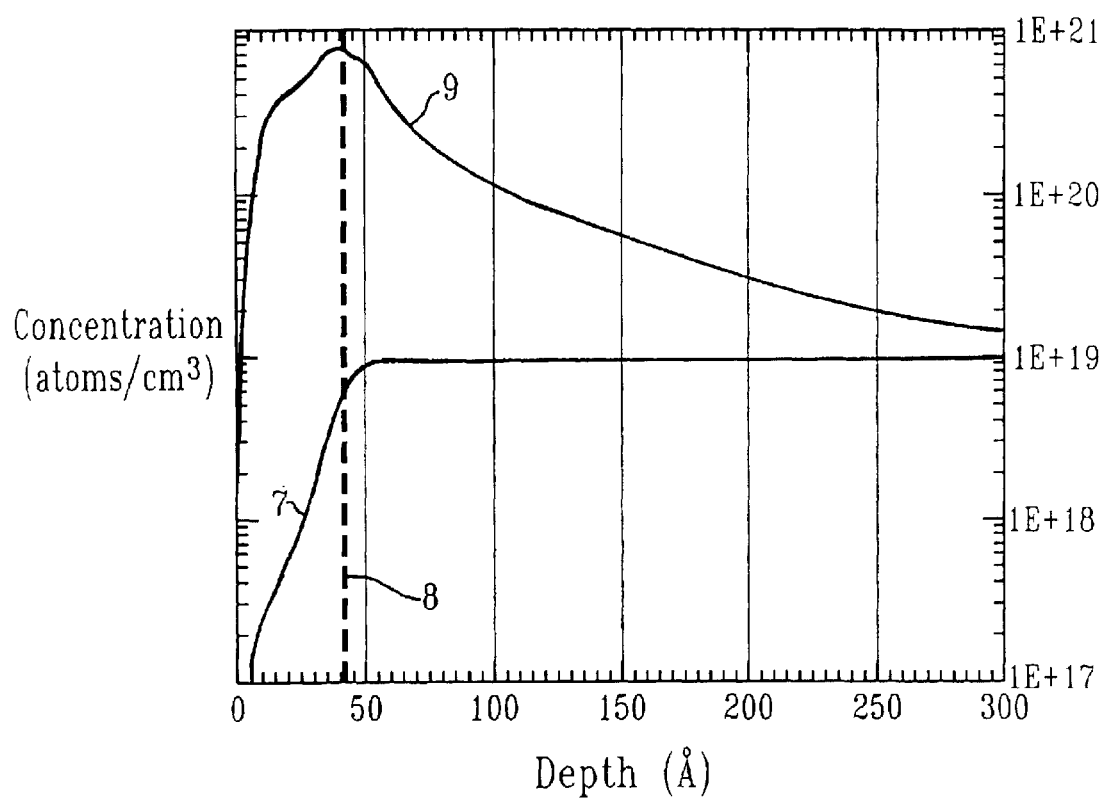
FIG. 2 is a graphical representation depicting the results of a Secondary Ion Mass Spectrometry (SIMS) depth profile analysis of a sample of a conventional formed silicon oxynitride layer atop a Si substrate.

The present invention, which provides a method for producing silicon oxynitride layers, will now be described in more detail by referring to the drawings that accompany the present application.

Atomic layer deposition of a silicon oxynitride layer in the present invention can be achieved by alternately pulsing a Si-containing, a N-containing and an O-containing precursor. Using atomic layer deposition, both the N content and N distribution within a silicon oxynitride film can be greatly controlled. Preferably, a high N concentration is formed across an upper region of the film opposite the gate dielectric/substrate interface. A preferred N:O ratio of the upper region of the film is 0.05 to 10. More preferably, a silicon oxynitride layer is formed having a low concentration of N at the gate dielectric/substrate interface. A preferred N:O ratio at the gate dielectric/substrate interface is 0 to 0.05.

Figure 3:
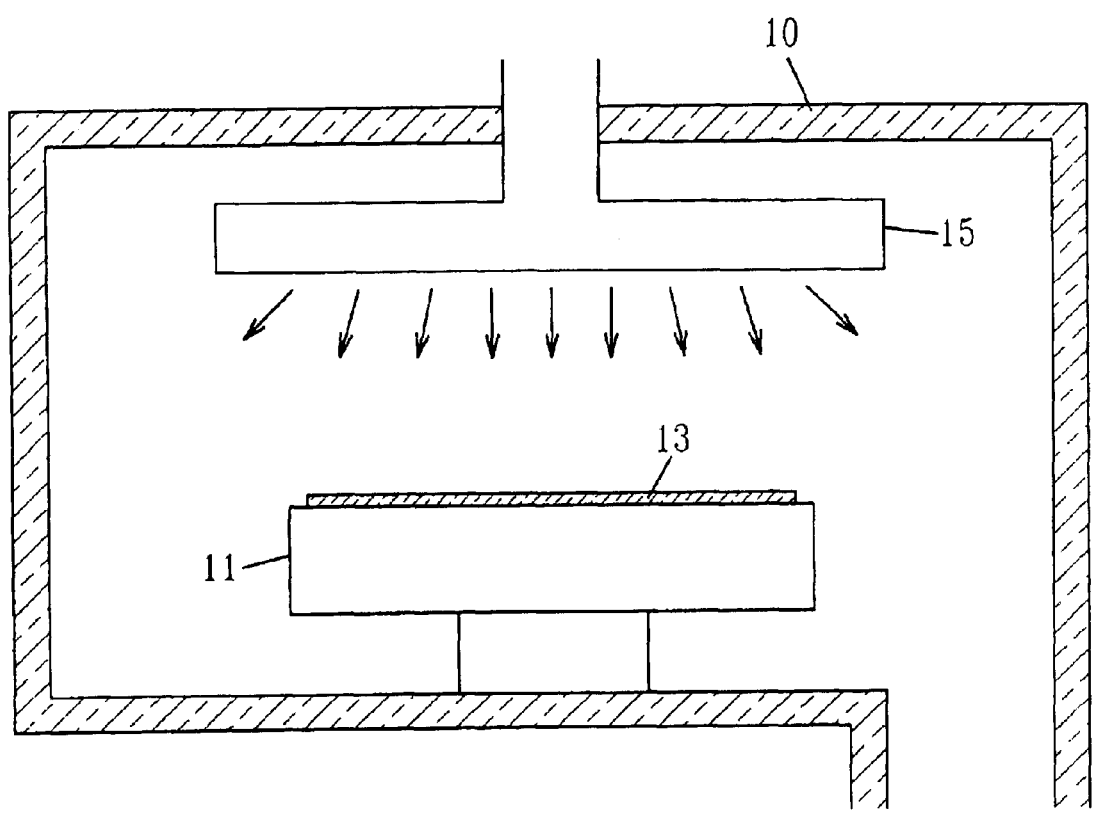
FIG. 3 is a pictorial representation (through cross sectional view) showing an atomic layer deposition apparatus.

Referring to FIG. 3, the atomic layer deposition apparatus employed in the present invention includes a vacuum chamber 10 and a heater 11 for heating a substrate 13 placed in the vacuum chamber 10 to an appropriate temperature. The substrate 13 is seated on a substrate holder (not shown) placed on top of the heater 11, and heated evenly, by the heater 11. A showerhead 15 through which a predetermined precursor gas flows into the vacuum chamber 10 is installed facing the surface of the substrate 13.

In the present invention, atomic layer deposition of uniquely qualified precursor elements allows for controlling both the N content and N distribution within the film being formed. Examples of the precursors include a Si-containing source, such as chlorinated Si-precursors including Si-tetrachloride, dichlorosilane, and monochlorosilane; a N-containing source, such as $NH_3$, $N_2H_4$, or plasma forming N* radicals; and an O-containing source such as $H_2O$, $H_2O_2$, $O_2$, $O_3$, or O* radicals.

Figure 4A:
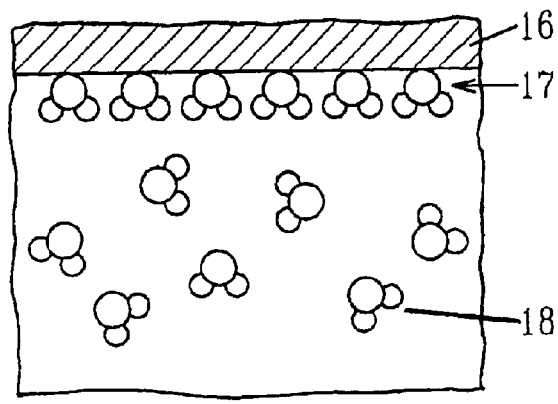
FIGS. 4(a)–(d) are pictorial representations (through cross sectional view) of chemisorption atop a substrate where precursor gasses form at least one monolayer.
Figure 4B:
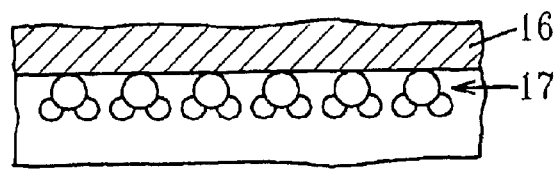
Figure 4C:
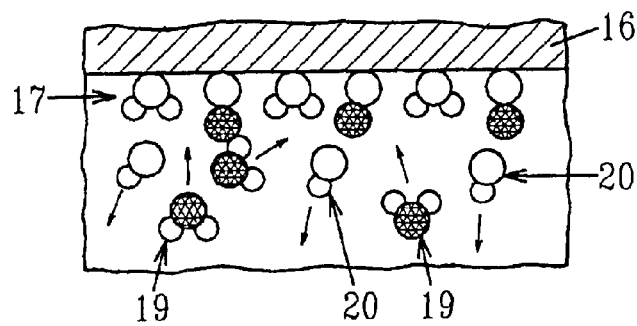
Figure 4D:
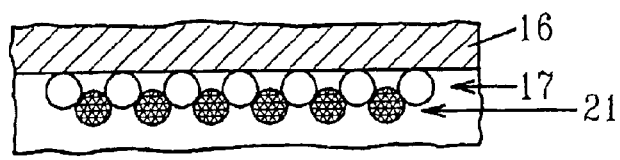

Referring to FIGS. 4(a) 4(d), in the atomic layer deposition process of the present invention, the deposited precursors have a self-limiting effect such that the precursor is chemisorbed on the substrate 16 in the form of a single monolayer. During chemisorption, molecules of precursor adsorb to the surface in a self-limiting manner, saturating it and forming a monolayer of precursor molecules. Because of the self-limiting effect, only one monolayer or sub-monolayer of each precursor is deposited per deposition cycle, and an additional precursor will not be covalently bound even when excess precursor is supplied. An additional precursor can be weakly bound, i.e., physisorbed. Physisorbed material is generally removed during the purge cycle.

Referring to FIG. 4(a), the first precursor readily adsorbs to bonding sites on the growth surface of the substrate 16 in a self-limiting mode. The first pulse of first precursor gas chemisorbs onto the surface until the surface becomes saturated with a first precursor monolayer 17. Once the surface is saturated, and bonding sites have been completely occupied by a first precursor, the surface becomes non-reactive to additional first precursor gas 18.

Referring to FIG. 4(b), the non-reacted additional first precursor gas 18 is then removed from the chamber of the atomic layer deposition apparatus during a purge step. The purge step utilizes a non-reactive gas to remove the non-reacted precursor 18 in order to avoid cross-contamination between deposition layers of the precursor molecules.

Referring to FIG. 4(c), the newly deposited first precursor monolayer 17 creates a reactive surface for the second precursor 19 such that it chemisorbs in a self-limiting manner to the first precursor monolayer 17. A desorbed species 20 from the first precursor monolayer 17 may be formed during the reaction between the first precursor monolayer 17 and the second precursor 19. Following the formation of a second precursor monolayer 21, a second purge step is conducted to remove the desorbed species 20 and non-reacted second precursor. The final structure comprises a first precursor monolayer 17 and a second precursor monolayer 21, as depicted in FIG. 4(d).

The order and composition of the precursor gasses pulsed is selected for the desired N content and N profile in the resultant layer. A preferred precursor gas cycle begins with a pulse cycle starting with the introduction of an O-containing precursor, followed by a Si-containing precursor, followed by a N-containing precursor, followed by a Si-containing precursor and then an O-containing precursor, where the remaining precursor constituents are selected to be consistent with the desired gate dielectric profile. Self-limiting chemistry only works if the precursor sequence is metal/non-metal; i.e., N-containing precursors cannot be directly followed by O-containing precursors. One example of a preferred precursor pulse is as follows: OSiNSiOSiN where Si represents SiH$_2$Cl$_2$, O represents H$_2$O, and N represents NH$_3$. Using the above cycle, a uniform N profile may be achieved, reducing N pile-up at the gate dielectric/substrate interface. An alternative precursor pulse includes: OSiOSiOSiNSiNSiN This pulsing sequence is designed to minimize N pile-up at the gate dielectric/substrate interface, by forming 2 monolayers of SiO followed by several monolayers of SiN. Because ALD and plasma assisted ALD can be conducted at low temperature (<500Å° C.), including sub-room-temperature (−200Å° C. to 23Å° C.) for certain radical assisted process steps, the N pile-up in thermal processes (800Å° C.–1000Å° C.) may be avoided.

Another aspect of the present invention is to form high-k gate containing a metal, O and N in a desired profile. One example is HfSiON, whose dielectric constant (k) can vary with composition, potentially in the range of k=5–15. One example of a pulse for forming a HfSiON gate dielectric is as follows: OSiOHfOHfOHfOSiN where Si represents SiH$_2$Cl$_2$ or SiCl$_4$; O represents H$_2$O or other O containing precursors such as O* radicals, H$_2$O$_2$, or O$_3$; and N represents NH$_3$ or other N containing precursor such as N* radicals and N$_2$H$_4$; and Hf represents HfCl$_4$ or another O containing precursor, such as Hf(OC$_2$H$_5$)$_4$ or Hf(OC$_4$H$_9$)$_4$.

Other metals such as Zr, Al, Y, La may also be desirable in the previously mentioned pulsing scheme.

Figure 5:
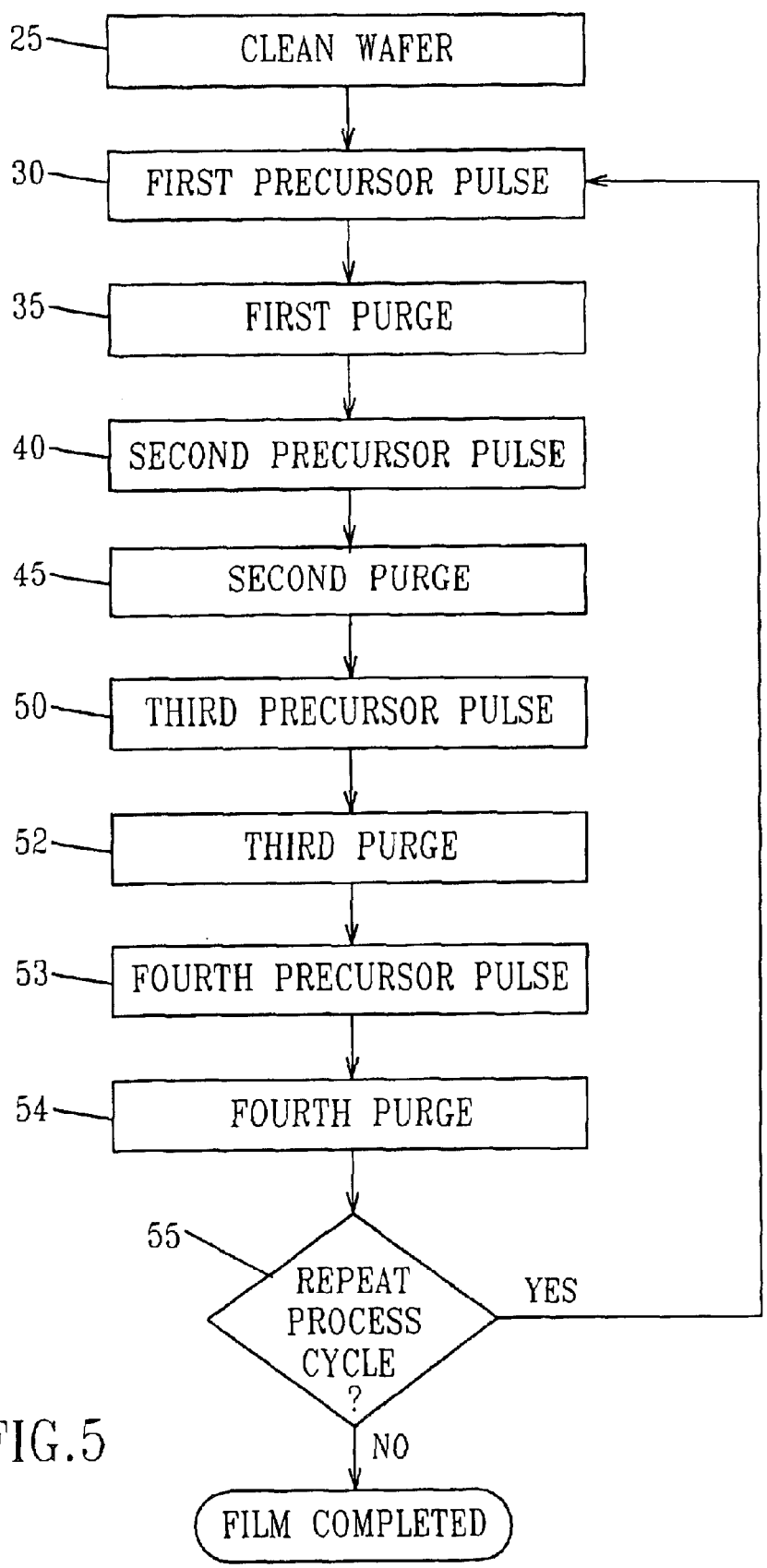
FIG. 5 illustrates a flow diagram of an atomic layer deposition process of the present invention for producing a silicon oxynitride film.

The preferred precursor cycle for forming a silicon oxynitride layer is now described in greater detail referring to the process flow diagram depicted in FIG. 5.

The inventive method for producing a silicon oxynitride film begins with providing a clean substrate surface, as illustrated in block 25 of FIG. 5. A clean substrate surface is provided where chemical cleaning of the wafer can be achieved using a dilute HF (0.5% HF in H$_2$O) dip in order to remove oxide and H terminate the surface of the substrate. Alternatively, a chemical oxide can be formed during wet cleaning by aqueous oxidants such as O$_3$ and H$_2$O$_2$. The cleaned substrate is then placed in the chamber 10 of an atomic layer deposition apparatus. The substrate preferably comprises Si-containing materials including, but not limited to: Si, single crystal Si, polycrystalline Si, SiGe, amorphous Si, epi-Si, silicon-on-insulator (SOI), SiGe-on-insulator (SGOI), annealed poly-Si, and poly-Si line structures.

Following substrate preparation, atomic layer deposition to form a silicon oxynitride layer begins with the application of the first precursor gas where a first portion of the first precursor is chemisorbed onto the substrate surface, as illustrated in block 30 of FIG. 5. The first precursor gas is preferably an O-containing precursor, such as H$_2$O, O$_2$, O$_3$, H$_2$O$_2$ or O* radicals, most preferably H$_2$O. The first pulse of precursor gas chemisorbs onto the surface until the surface becomes saturated, or OH terminated, ceasing the reaction. The newly deposited first precursor monolayer creates a reactive surface for the second precursor such that the second precursor gas chemisorbs in a self-limiting manner.

One advantage of atomic layer deposition is the ability to deposit material at low temperatures, preferably in a range −200Å° C. to +375Å° C. The low deposition temperature allows the wafer surface to be exposed to H$_2$O during the first precursor pulse in order to terminate the surface of the substrate with OH groups. The surface is preferably terminated with OH in order to allow for subsequent surface reactions with a Si-containing precursor, such as dichlorosilane. If the surface is terminated with H instead of OH groups, the process will occur at a slower rate and is more likely to result in island growth. The surface may be terminated using a first precursor gas to deposit N, such as NH$_3$, in order to produce a barrier effect, but O-containing precursors are preferred.

The kinetics of chemisorption are temperature driven. Higher process temperatures result in higher fractional coverages during each precursor pulsing sequence. Therefore higher deposition rates occur at elevated temperatures. Faster kinetics have been demonstrated with catalytic or radical assisted techniques showing pulse times on the order of tens of seconds, allowing a 1 nm film comprising from about 12 pulse cycles to be formed on the order of hundreds of seconds. Alternatively, radical assisted techniques can be used to conduct certain process steps at reduced temperature including sub-room-temperature process steps (−200Å° C. to 23Å° C.).

The chamber pressure of the atomic layer deposition apparatus is maintained in a range from 100 to 500 mtorr and can be maintained constant throughout the process or can be varied.

Following the deposition of the first precursor molecule, a purge step 35 is conducted. See FIG. 5. An inert purge is typically employed in order to avoid cross contamination between each precursor pulse. Purge gasses may include He, Ar, Ne, Xe, Kr and/or N$_2$. The first deposition cycle concludes with the termination of the purge step.

Alternatively, the surface of the substrate may be OH terminated by exposing a Si-substrate to an oxidizing ambient. In addition the substrate may be OH terminated by a wet clean step where an aqueous solution containing oxidants, such as ozone or peroxide, contacts the substrate surface oxidizing it.

A second precursor is then pulsed (see box 50 of FIG. 5) in the chamber during a second pulse, as illustrated in block 40 of FIG. 5. In the preferred embodiment, the second pulse is a Si-containing precursor, such as silicon tetrachloride, dichlorosilane, monochlorosilane, or combinations thereof, most preferably dichlorosilane. During the second precursor reaction, the —OH from the terminated surface of the substrate attacks the Si-containing precursors and bonds to the Si metal center. HCl is formed during the precursor reaction, between Cl from the Si-containing precursor and H from the OH groups of the first precursor monolayer and desorbs from the substrate surface. The surface of the first precursor monolayer chemisorbs the second precursor molecules where a reaction between the first precursor monolayer and the second precursor contributes to the growth of the layer until the surface reactions of the first precursor monolayer reach conclusion. When the entire surface of the first precursor monolayer has reacted, no further reaction can occur because the newly deposited second precursor monolayer is non-reactive with the remaining second precursor gas.

The second precursor gas is applied to the substrate at a temperature from about room temperature to about 500Å° C.; more preferably from about 100Å° C. to about 450Å° C.; most preferably at about 450Å° C. Temperatures in excess of 500Å° C. may result in decomposition of the molecules and a deposition process similar to chemical vapor deposition, which does not deposit a single monolayer of precursor molecules. The chamber pressure is maintained in a range from 100 to 500 mtorr and can be maintained constant throughout the process or can be varied.

Following the deposition of the second precursor molecule a second purge step 45 is conducted. See FIG. 5. The second purge step is conducted to remove the desorbed HCl and non-reacted second precursor. An inert purge is necessary in order to avoid cross contamination between each reactant pulse. Purge gasses may include be $N_2$ or Ar.

A third precursor is then pulsed into the chamber of the atomic layer deposition apparatus, where a first portion of the third precursor is chemically reacted with the chemisorbed portion of the second precursor to form a monolayer of third precursor. Preferably the third precursor gas is a N-containing precursor such $NH_3$ in an Ar carrier pulsed at a rate of 2000 sccm. N-containing precursors also include $NH_3$, $N_2H_4$, or plasma forming N* radicals, most preferably being $NH_3$. The desorbed species after the N-containing precursor reaction will be HCl. Precursor pulses prior to the deposition of N may also be referred to as interface pulses, and include Si-containing precursors and O-containing precursor. Interface pulses ensure that an interface between the gate dielectric and substrate is formed having a low concentration of N, yielding an N:O ratio in the range of 0 to 0.05. In the case of radical containing precursor (e.g. N*), the process temperature can be beneficially reduced as compared to other steps, including sub-room-temperature (−200Å° C. to 23Å° C.) range. Reduced temperature retards the diffusion of nitrogen-containing radicals in the interface layer and prevents an excessive nitrogen pile-up at the substrate interface. At the same time, the high chemical reactivity of nitrogen-containing radicals insures a relatively fast rate of the surface reaction. The non-chemically reacted portion of the third precursor is removed from the chamber and any desorbed gas from the deposited film is then removed during a third purge step.

Following the third purge 52 step, a fourth precursor 53 is employed. Chemisorption, self-limiting chemistry, requires that the precursor sequence is metal/non-metal. Therefore, N-precursors cannot be directly followed by O-precursors. Preferably, a metal precursor, such as $SiCl_4$, is pulsed following N-precursors in order to create the Si—Cl bonds for further $NH_3$ to react with. During the fourth precursor pulse 53, bonding between the Si of the precursor and the N of the third precursor monolayer create a fourth precursor monolayer of Si. A desorption species is also formed during the above described fourth precursor pulse 53 reaction in the form of HCl gas. The desorbed species is then removed from the atomic layer deposition chamber 10 during a fourth purge step 54. Alternatively the fourth precursor may comprise Hf-containing precursors. The above cycle is repeated dependent on the design requirements of the deposited film, as illustrate in block 55.

The above process allows for N to be placed at the top, bottom or middle of the film, depending on the relative order of the precursor pulses. Allowing the combination of Si-containing, O-containing, and N-containing precursors in a manner that allows discrete control over the placement of Si, N, and O to enhance the electrical performance of the silicon oxynitride layer such as electron mobility and capacitance. Furthermore, increasing the number of N-containing pulses and limiting the number of O-containing pulses can increase the N content of the layer.

Using the above method with a deposition rate of approximately 0.05 to about 0.1 nm/cycle would yield films in the 1.0–2.0 nm range with uniform N content at a low deposition temperature of approximately 500Å° C.

Another aspect of the present invention is an integration scheme, where a thick dielectric 65, having a first thickness W1, is incorporated to decrease power consumption of the device and a thin dielectric 75, having a second thickness W2, is utilized to increase device performance. A combination of a thick dielectric layer 65 and a thin dielectric layer 75 is used in order to balance the performance enhancing ability of a thin dielectric layer 75 with the ability of the thick dielectric 65 to reduce leakage current. The thick dielectric layer 65 has a first thickness W1 ranging from about 2–6 nm. The thin dielectric layer 75 has a second thickness W2 ranging from about 1–2 nm.

In the prior art, the thick dielectric layer 65 is typically formed first followed by the formation of the thin dielectric layer 75, where the thick dielectric layer 65 is exposed to the processing steps utilized to form the thin dielectric layer 75. Therefore, when forming a thin layer of silicon oxynitride utilizing conventional deposition processing steps, such as chemical vapor deposition and thermal nitridation, the already existing thick dielectric layer is nitrided. The nitridation of the interface between the thick dielectric 65 and the Si-containing substrate can degrade the performance and reliability of the device. Utilizing the inventive method of atomic layer deposition, a thin silicon oxynitride 75 film is formed without nitriding the underlying thick dielectric/silicon interface 65.

Figure 6A:
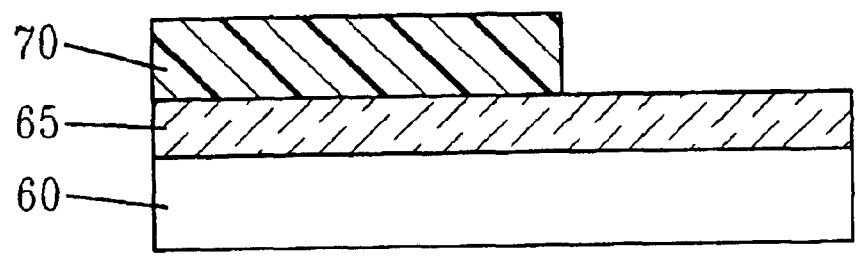
FIGS. 6(a)–(c) are pictorial representations (through cross sectional views) showing the basic processing steps of the present invention for forming a composite gate dielectric.
Figure 6B:
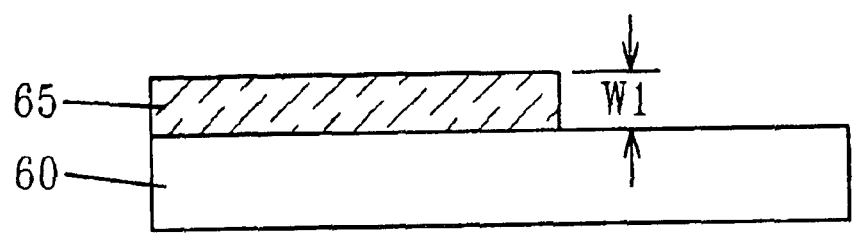
Figure 6C:
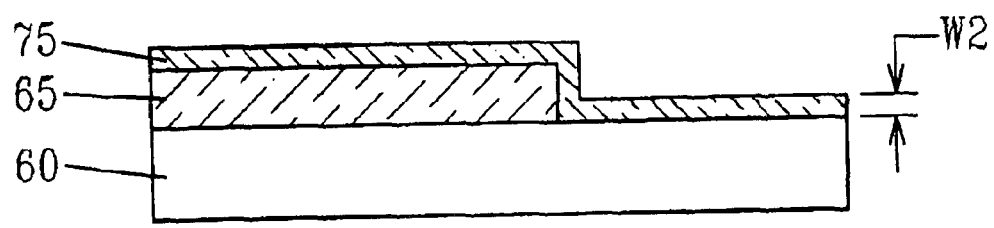

Referring to FIGS. 6(a)–6(c): a thick dielectric 65, having a first thickness W1, is first deposited or thermally grown atop the substrate 60. The thick dielectric 65 has a thickness in the range of 2.0–6.0 nm. The thick dielectric 65 may include $SiO_2$ or $SiO_xN_y$ grown in a furnace or with a rapid thermal process (RTP). The N content in these films is relatively low with N:O ranging from 0–0.05. A layer of photoresist material 70 is then deposited atop the thick dielectric 65 and selectively patterned to expose pre-selected portions of the thick dielectric 65. An etching step is next applied where the exposed portions of the thick dielectric 65 are removed, while the regions protected by the remaining patterned photoresist 70 remain. Alternatively a layer of silicon oxynitride may be deposited to place N at the top of the thick oxide 65 using atomic layer deposition. The resulting structure following etching is depicted in FIG. 6(b).

Now referring to FIG. 6(b), the photoresist layer 70 is removed using a conventional photoresist-stripping step. Alternatively, the photoresist layer 70 may remain in the device structure, where the photoresist layer 70 ensures that silicon oxynitride is not deposited atop the thick oxide layer 65. Since atomic layer deposition is a low temperature process, there may be no need to strip the photoresist layer 70 because the photoresist layer 70 will be stable under 400Å° C. Incorporating the photoresist layer 70 into the structure of the device ensures that the N from the later formed thin layer of silicon oxynitride does not diffuse to the thick gate dielectric/substrate interface in the regions below the photoresist layer 70. A thin dielectric layer 75, having a second thickness W2, is then formed atop the thick dielectric layer 65 using the above-described atomic layer deposition process. The thickness of the thin dielectric layer 75 is about 1–2 nm. The above integration scheme prevents N from diffusing to the gate dielectric/substrate interface of the thick dielectric layer 65 by controlling the N distribution in the thin film of silicon oxynitride through the above described atomic layer deposition process. Additionally, atomic layer deposition is a low temperature process. Low temperature process steps reduce the probability that N migrates to the thick dielectric/substrate interface since the low processing temperature does not provide enough thermal energy to diffuse N to the gate dielectric/substrate interface.

Alternatively, the thin dielectric layer 75 may be formed by depositing or thermally growing an oxide material and then forming a thin layer of silicon oxynitride atop the thin dielectric layer 75 using atomic layer deposition (ALD). Following thick dielectric formation 65a thin dielectric oxide layer 75 is formed atop the thick dielectric layer and substrate using wet clean processes, where an aqueous solution containing oxidants, such as ozone or peroxide, contacts the surface of the substrate oxidizing it. Alternatively, the thin oxide layer is thermally grown as an RTP or furnace oxide layer. The thin dielectric oxide layer has a thickness ranging from about 1 nm to about 2 nm. The N:O ratio of the thin dielectric oxide layer 75 may range from 0.0 to 0.10. A layer of silicon oxynitride is then deposited atop the thin dielectric oxide layer 75 through ALD processing to incorporate N into the topmost layers of the film. The thickness of the ALD layer would be less than 2 nm and have a N:O ratio approaching pure SiN. In this embodiment, the silicon oxynitride layer may only be deposited atop the thin dielectric layer 75 by utilizing atomic layer deposition and a patterned layer of photoresist 70 positioned atop the thick dielectric layer 65.

Another aspect of the present invention is to form a thin layer of high-k dielectric, such as HfSiON; atop both the thin dielectric layer 75 and thick dielectric layer 65 using atomic layer deposition. The thin dielectric layer 75 and thick dielectric layer 65 may comprise oxides. The resultant structure including a thin layer of HfSiON is ideally suited for producing gate dielectrics utilized in low power applications. Following thick dielectric 65 formation, a thin dielectric 75, having a thickness less than 2.0 nm, is formed atop either the entire substrate or atop portions of the substrate and the thick dielectric layer 65 via oxidation during RTP or wet chemical oxide layer growth. The N:O ratio of the furnace or RTP thin dielectric layer 75 would range from about 0.0 to 0.10. A layer of HfSiON is then deposited atop the thin dielectric oxide layer 75 through ALD processing, to incorporate Hf, Si, O and N into the topmost layers of the film as dictated by the pulsing sequence previously described. The thickness of the ALD layer would be less than 5 nm and have a k value ranging from 5–15.

Alternatively, the thin layer of high-k HfSiON may only be deposited atop the thin dielectric layer 75 by utilizing atomic layer deposition and a patterned layer of photoresist 70 positioned atop the thick dielectric layer 65. First a thick dielectric 65 is grown in a furnace or RTP with a thickness ranging from about 2–6 nm having N:O ratio ranging from about 0–0.05. A portion of the thick dielectric layer 65 is then covered with patterned photoresist 70. The thick dielectric layer 65 is then selectively etched exposing portions of the Si substrate 60. HfSiON is then formed atop the exposed portions of the Si substrate 60 via low temperature ALD process, where the patterned photoresist 70 protects the thick dielectric 65 underlying the patterned photoresist 70.

Figure 7:
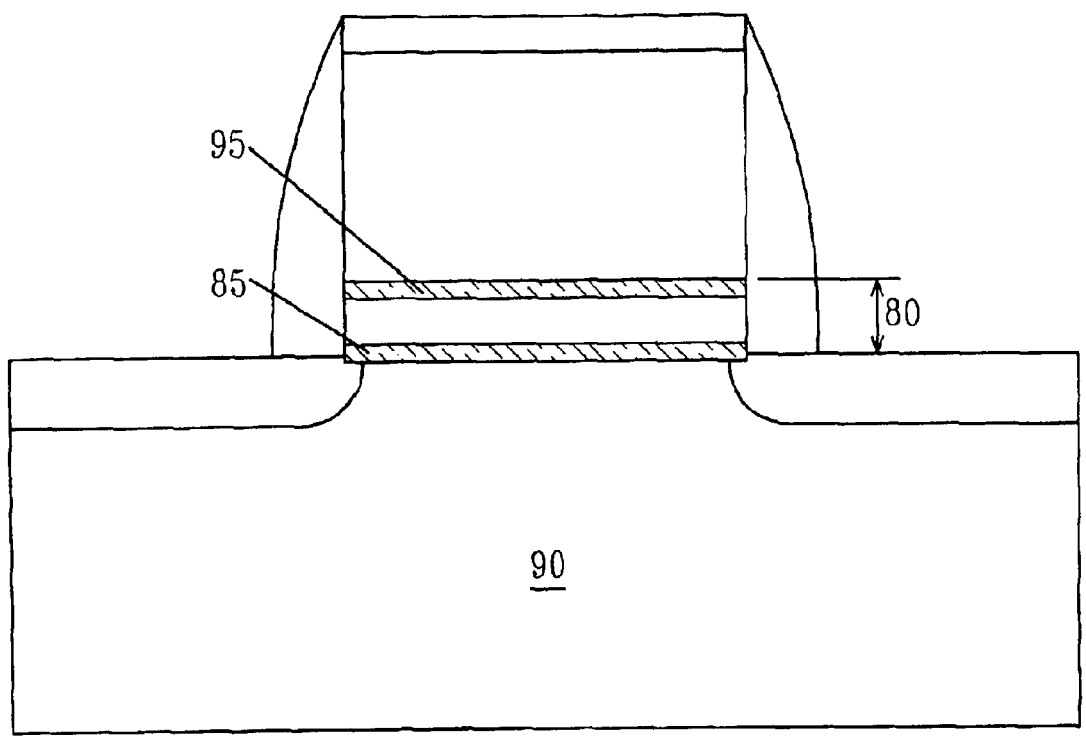
FIG. 7 is a pictorial representation (through cross sectional view) of a semiconductor device comprising a silicon oxynitride gate dielectric having a N-profile with a low concentration of N at the interface between the silicon oxynitride film and the underlying substrate.

Referring to FIG. 7, another aspect of the present invention is a semiconductor device comprising a silicon oxynitride gate dielectric 80 having N:O ratio of 0 to about 0.05 at the interface 85 between the silicon oxynitride gate dielectric and the substrate 90, where the silicon oxynitride gate dielectric 80 includes trace amounts of Cl, on the order of about 1 atomic percent. Another embodiment of the present invention is where the silicon oxynitride gate dielectric 80 further comprises a high N:O ratio, in the range of about 0.05 to about 10, at an upper surface region 95 opposite the interface 85 between the silicon oxynitride gate dielectric 80 and the substrate 90.

Another aspect of the present invention is a semiconducting device comprising a HfSiON gate dielectric layer, where the atomic % of Hf is less than about 15%; the atomic % of Si is about 20% to about 35%; the atomic % of O is about 55% to about 60%; and the atomic % of N is less than about 10%. The most preferred HfSiON layer composition is about $Hf_{10}Si_{25}O_{60}N_5$.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an insulating film comprising:
    a) pulsing a first precursor atop a substrate to provide an OH terminated substrate;
    b) performing a first purge;
    c) pulsing a Si-containing precursor onto said OH terminated surface so that said OH terminated substrate chemisorbs a portion of said Si-containing precursor to form a Si-monolayer;
    d) performing a second purge; and
    e) pulsing a N-containing precursor onto said Si-monolayer so that said Si-monolayer chemisorbs a portion of said N-containing precursor to form a N-monolayer, wherein as $SiO_xN_y$ layer is formed by steps a–e at an interface between the substrate and a gate dielectric, the $SiO_xN_y$ having a controlled N concentration.

2. The method of claim 1 further comprising the steps of:
    f) pulsing an other Si-containing precursor or a Hf-containing precursor to form an other Si-monolayer or a Hf-monolayer; and
    g) pulsing an O-containing precursor or an other N-containing precursor to form an O-monolayer or other N-monolayer.

3. The method of claim 2, where step f) and step g) are performed (n) times, where (n) is a whole number equal to or greater than 1 and less than 50.

4. The method of claim 1 where said providing said OH terminated surface comprises pulsing an O-containing precursor atop a substrate, oxidizing said substrate in an oxidizing ambient, or wet cleaning said substrate with an aqueous solution containing oxidizers.

5. The method of claim 1, where step b) and c) further comprises purging an O-containing precursor, where said Si-monolayer chemisorbs a portion of said O-containing precursor to form an O-monolayer; and pulsing an other Si-containing precursor, where said O-monolayer chemisorbs a portion of said other Si-containing precursor.

6. The method of claim 1, where said N-containing precursor comprises $NH_3$, $N_2H_4$, or plasma forming N* radicals.

7. The method of claim 1, where said Si-containing precursor comprises Si-tetrachloride, di-chlorosilane, monochlorosilane, or combinations thereof.

8. The method of claim 4, where said O-containing precursor comprises $H_2O$, $H_2O_2$, $O_2$, $O_3$, or O* radicals.

9. The method of claim 2, where said Hf-containing precursor comprises $HfCl_4$, $Hf(OC_2H_5)_4$, or $Hf(OC_4H_9)_4$.

10. A method for forming a composite gate dielectric comprising:
    providing a substrate;
    forming a first dielectric layer atop the substrate; and forming a second dielectric layer atop said first dielectric layer, where said second dielectric layer is formed by pulsing an O-containing precursor atop said first dielectric layer to form an O-monolayer, performing a first purge, pulsing a Si-containing precursor atop said O-monolayer to form a Si-monolayer, performing a first purge, and pulsing a N-containing precursor atop said Si-monolayer to form a N-monolayer, where said pulsing said O-containing precursor, said pulsing said Si-containing precursor, and said pulsing said N-containing precursor is performed (n) times, where (n) is a whole number equal to or greater than 1, thereby forming a SiO$_x$N$_y$ layer having a controller N concentration at an interface between the substrate and the gate dielectric.

11. The method of claim 10, where said first dielectric layer comprises SiO$_2$, or silicon oxynitride.

12. The method of claim 10, where said first dielectric layer has a thickness of about 2 to about 6 nm.

13. The method of claim 10, where said second dielectric layer has a thickness of about 1 to about 2 nm.

14. The method of claim 10, where said second dielectric layer is comprised of silicon oxynitride.

15. The method of claim 10, further comprising forming a photoresist layer atop a portion of said first gate dielectric; where said second dielectric layer is formed atop said first dielectric layer and atop said photoresist layer.

16. The method of claim 10, further comprising forming a patterned photoresist layer atop a portion of said first gate dielectric, where a remaining portion of said first gate dielectric is exposed; etching said remaining portion of said first gate dielectric exposing said substrate; stripping said patterned photoresist layer; and forming said second dielectric layer atop said first dielectric layer and atop said substrate.

17. The method of claim 10, where said first dielectric layer includes a top layer of HfSiON.

18. A semiconductor device comprising:
a silicon oxynitride layer atop a substrate where said silicon oxynitride layer comprises a N:O concentration ratio from about 0 to about 0.50 at an interface between said silicon oxynitride layer and said substrate, where said silicon oxynitride layer includes Cl on the order of about 1 atomic percent.

19. The semiconductor device of claim 18, where said silicon oxynitride layer comprises a N:O concentration ratio from about 0.05 to 10 about at a surface opposite said interface between said silicon oxynitride layer and said substrate.

20. The semiconductor device of claim 18 where said silicon oxynitride layer further comprises Hf, where the concentration of Hf is less then 15 atomic %.

* * * * *